(12) United States Patent
Lee et al.

(10) Patent No.: US 8,921,214 B2
(45) Date of Patent: Dec. 30, 2014

(54) VARIABLE RESISTANCE MEMORY DEVICE AND METHOD FOR FABRICATING THE SAME

(71) Applicant: SK Hynix Inc., Icheon-si (KR)

(72) Inventors: Kee-Jeung Lee, Icheon-si (KR);
Beom-Yong Kim, Icheon-si (KR);
Wan-Gee Kim, Icheon-si (KR);
Woo-Young Park, Icheon-si (KR)

(73) Assignee: SK Hynix Inc., Icheon (KR)

( * ) Notice: Subject to any disclaimer, the term of this patent is extended or adjusted under 35 U.S.C. 154(b) by 102 days.

(21) Appl. No.: 13/842,155

(22) Filed: Mar. 15, 2013

(65) Prior Publication Data

US 2014/0170830 A1    Jun. 19, 2014

(30) Foreign Application Priority Data

Dec. 17, 2012    (KR) .................. 10-2012-0147366

(51) Int. Cl.
| H01L 21/26 | (2006.01) |
| H01L 21/42 | (2006.01) |
| H01L 45/00 | (2006.01) |
| H01L 27/24 | (2006.01) |

(52) U.S. Cl.
CPC .......... *H01L 45/1616* (2013.01); *H01L 45/145* (2013.01); *H01L 45/04* (2013.01); *H01L 45/08* (2013.01); *H01L 45/1233* (2013.01); *H01L 45/146* (2013.01); *H01L 27/2481* (2013.01)
USPC .......................... 438/513; 438/798; 257/314

(58) Field of Classification Search
CPC ............................. H01L 45/145; H01L 45/04
USPC .................................. 257/314; 438/513, 798
See application file for complete search history.

(56) References Cited

U.S. PATENT DOCUMENTS

| 7,148,533 | B2 * | 12/2006 | Hsu et al. ...................... 257/295 |
| 7,763,880 | B2 * | 7/2010 | Williams .......................... 257/8 |
| 8,367,486 | B2 * | 2/2013 | Sakata .......................... 438/151 |
| 8,569,728 | B2 * | 10/2013 | Takano et al. ...................... 257/2 |
| 8,766,234 | B1 * | 7/2014 | Hashim et al. .................... 257/4 |
| 8,779,406 | B2 * | 7/2014 | Ito et al. ............................ 257/2 |
| 8,792,268 | B2 * | 7/2014 | Katoh ............................ 365/154 |
| 2006/0050549 | A1 | 3/2006 | Adachi et al. |

FOREIGN PATENT DOCUMENTS

KR    10-2011-0024479 A    3/2011

* cited by examiner

*Primary Examiner* — Olik Chaudhuri (57) ABSTRACT

A method for fabricating a variable resistance memory device includes forming an oxygen-deficient first metal oxide layer over a first electrode, forming an oxygen-rich second metal oxide layer over the first metal oxide layer, treating the first and second metal oxide layers with hydrogen-containing plasma, forming an oxygen-rich third metal oxide layer, and forming a second electrode over the third metal oxide layer.

18 Claims, 8 Drawing Sheets

VARIABLE RESISTANCE MEMORY DEVICE AND METHOD FOR FABRICATING THE SAME

CROSS-REFERENCE TO RELATED APPLICATIONS

The present application claims priority of Korean Patent Application No. 10-2012-0147366, filed on Dec. 17, 2012, which is incorporated herein by reference in its entirety.

BACKGROUND

1. Field

Embodiments of the present invention relate to a semiconductor technology, and more particularly, to a variable resistance memory device and a method for fabricating the same.

2. Description of the Related Art

Recently, a variety of variable resistance memory devices have been developed. The term "variable resistance memory device" refers to a device which stores data using a variable resistance material switching between different resistance states depending on an applied bias.

A variable resistance memory device in which switching occurs due to a filament serving as a kind of current path that is locally created/destroyed in a variable resistance material layer formed of metal oxide is referred to as ReRAM (Resistive Random Access Memory). Because the creation/destruction of the filament occurs according to the behavior of oxygen vacancies within the metal oxide in certain devices, the variable resistance material layer in such devices must have a layer including oxygen vacancies.

Specifically, the variable resistance material layer may include a double layer of an oxygen-deficient metal oxide layer containing oxygen at a lower ratio than a stoichiometric ratio, and thus including a large quantity of oxygen vacancies, and an oxygen-rich metal oxide layer satisfying the stoichiometric ratio. The oxygen-deficient metal oxide layer supplies oxygen vacancies to the oxygen-rich metal oxide layer, and the oxygen-rich metal oxide layer corresponds to a layer in which a filament is created or destroyed depending on whether or not oxygen vacancies are introduced from the oxygen-deficient metal oxide layer, and switching occurs.

The double layer may have a structure in which the oxygen-deficient metal oxide layer is positioned at the bottom and the oxygen-rich metal oxide layer is positioned at the top, or vice versa.

However, when the oxygen-rich metal oxide layer is positioned over the oxygen-deficient metal oxide layer, a part of the oxygen-deficient metal oxide layer may be oxidized during deposition of the oxygen-rich metal oxide layer. In this case, oxygen vacancy density may decrease, and thus the switching characteristics may be degraded.

SUMMARY

Various embodiments are directed to a variable resistance memory device and a method for fabricating the same, which is capable of implementing a multi-stack structure which has an excellent switching characteristic.

In an embodiment, a method for fabricating a variable resistance memory device includes: forming an oxygen-deficient first metal oxide layer over a first electrode; forming an oxygen-rich second metal oxide layer over the first metal oxide layer; treating the first and second metal oxide layers with hydrogen-containing plasma; forming an oxygen-rich third metal oxide layer; and forming a second electrode over the third metal oxide layer.

In another embodiment, there is provided a method for fabricating a variable resistance memory device which includes a first variable resistance material layer interposed between first and second electrodes and including an oxygen-deficient metal oxide and an oxygen-rich metal oxide which are sequentially stacked therein and a second variable resistance material layer interposed between the first electrode and a third electrode and including an oxygen-rich metal oxide and an oxygen-deficient metal oxide which are sequentially stacked therein. The method includes forming the first variable resistance material layer, wherein the forming of the first variable resistance material layer includes: forming an oxygen-deficient first metal oxide layer; forming an oxygen-rich second metal oxide layer over the first metal oxide layer; treating the first and second metal oxide layers with hydrogen-containing plasma; and forming an oxygen-rich third metal oxide layer.

In another embodiment, a variable resistance memory device includes: a first electrode; an oxygen-deficient first metal oxide layer formed over the first electrode; an oxygen-deficient second metal oxide layer formed over the first metal oxide layer; an oxygen-rich third metal oxide layer formed over the second metal oxide layer; and a second electrode over the third metal oxide layer, wherein the first metal oxide layer includes a different metal from the second metal oxide layer, and the second metal oxide layer includes the same metal as the third metal oxide layer.

In another embodiment, a variable resistance memory device includes: a first variable resistance material layer interposed between first and second electrodes and including an oxygen-deficient first metal oxide layer, an oxygen-deficient second metal oxide layer, and an oxygen-rich third metal oxide layer which are sequentially stacked; and a second variable resistance material layer interposed between the first electrode and a third electrode and including an oxygen-rich metal oxide and an oxygen-deficient metal oxide which are sequentially stacked, wherein the first metal oxide layer includes a different metal from the second metal oxide layer, and the second metal oxide layer includes the same metal as the third metal oxide layer.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Figure 1A:
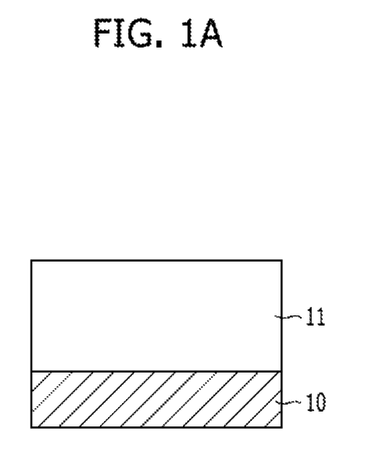
FIGS. 1A to 1E are cross-sectional views illustrating a variable resistance memory device and a method for fabricating the same in accordance with an embodiment of the present invention.
Figure 1B:
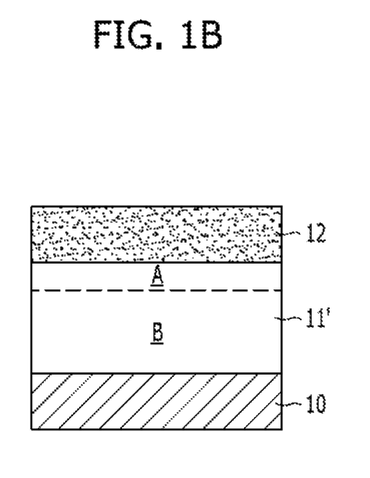
Figure 1C:
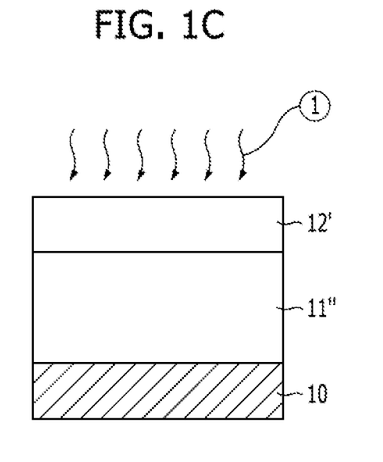
Figure 1D:
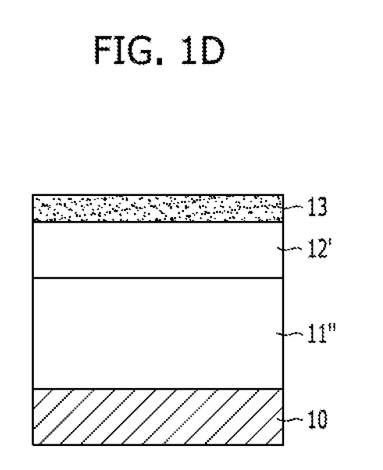
Figure 1E:
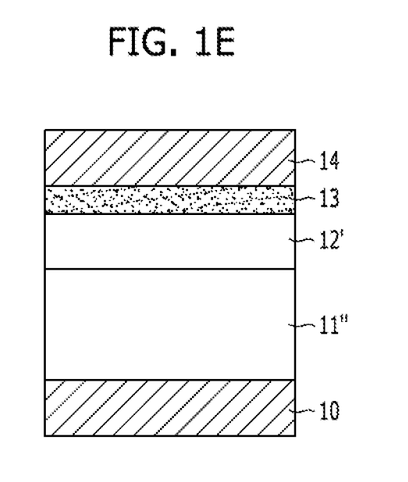

FIGS. 1A to 1E are cross-sectional views illustrating a variable resistance memory device and a method for fabricating the same in accordance with an embodiment of the present invention. In particular, FIGS. 1A to 1E illustrate a device including a variable resistance material layer in which an oxygen-deficient metal oxide layer and an oxygen-rich metal oxide layer are sequentially stacked, and a method for fabricating the same. FIG. 1E illustrates the device, and FIGS. 1A to 1D illustrate process steps for fabricating the device of FIG. 1E.

Referring to FIG. 1A, a first electrode 10 is formed over a substrate (not illustrated) including a predetermined lower structure.

The first electrode 10 serves to apply a voltage to a variable resistance material layer, like a second electrode which will be described below. The first electrode 10 may include a conductive material, for example, a metal such as platinum (Pt), tungsten (W), aluminum (Al), copper (Cu), tantalum (Ta) and the like or a metal nitride such as titanium nitride (TiN), tantalum nitride (TaN) and the like.

The first metal oxide layer 11 is formed over the first electrode 10. The first metal oxide layer 11 may include Ti oxide, Ta oxide, Fe oxide, W oxide, Hf oxide, Nb oxide, Zr oxide and the like.

The first metal oxide layer 11 may include an oxygen-deficient metal oxide layer that has a lower oxygen content than the oxygen-rich metal oxide layer discussed below. For example, the first metal oxide layer 11 may be a metal oxide layer which contains oxygen at a lower ratio than a stoichiometric ratio, and may include $TiO_x$ where the value of x is less than 2. The oxygen deficient first metal oxide layer 11 may be formed by physical vapor deposition (PVD), atomic layer deposition (ALD), or chemical vapor deposition (CVD).

Referring to FIG. 1B, a second metal oxide layer 12 is formed over the first metal oxide layer 11. The second metal oxide layer 12 may include Ti oxide, Ta oxide, Fe oxide, W oxide, Hf oxide, Nb oxide, Zr oxide and the like, and may be formed of metal oxide different from the metal of the first metal oxide layer 11.

The second metal oxide layer 12 may be an oxygen-rich metal oxide layer with a higher oxygen content than the first metal oxide layer 11. For example, in an embodiment, the second metal oxide layer 12 is a metal oxide layer which satisfies the stoichiometric ratio. For example, the second metal oxide layer 12 may include $Ta_2O_5$. As such, the oxygen-rich second metal oxide layer 12 may be formed by PVD, ALD, or CVD. ALD or CVD uses an amount of reactant gas containing oxygen that is sufficient to dissolve the metal source. Therefore, when ALD or CVD is used, a metal oxide having a relatively high oxygen content, for example, a metal oxide satisfying the stoichiometric ratio, may be formed.

Thus, while the first metal oxide layer 11 is formed by PVD, the second metal oxide layer 12 may be formed by ALD or CVD.

During the deposition process, a part of the first metal oxide layer 11 may be oxidized by the oxygen-containing reactant gas used when the second metal oxide layer 12 is formed. Hereafter, the first metal oxide layer, which is partially oxidized by this process, is referred to as an oxidized first metal oxide layer 11'.

As seen in FIG. 1B, the oxidized first metal oxide layer 11' may have an upper portion A which is oxidized and has a relatively high oxygen content, and a lower portion B which is oxygen deficient. For example, when the first metal oxide layer 11 includes $TiO_x$ where the value of x is 1.7, the value of x in lower portion B of oxidized first metal oxide layer 11' may be 1.7, while the value of x in upper portion A may be within the range of 1.7 to 2. Accordingly, the number of oxygen vacancies contained in the oxidized first metal oxide layer 11' is lower than the number of oxygen vacancies in first metal oxide layer 11. In an embodiment, a process of FIG. 1C is subsequently performed to compensate for the decrease in the number of oxygen vacancies.

Referring to FIG. 1C, as the resultant structure of FIG. 1B is treated by hydrogen-containing plasma (shown as CD), the oxidized first metal oxide layer 11' and the second metal oxide layer 12 are reduced to regenerate oxygen vacancies therein. The oxidized first metal oxide layer 11' and the second metal oxide layer 12, which are reduced by this process, are subsequently referred to as a reduced first metal oxide layer 11" and a reduced second metal oxide layer 12'.

Since the reduced first metal oxide layer 11" has been reduced from the oxidized first metal oxide layer 11', the reduced first metal oxide layer 11" may become an oxygen-deficient metal oxide layer, similar to the original state of the first metal oxide layer 11. Furthermore, since the reduced second metal oxide layer 12' has a lower oxygen content than the second metal oxide layer 12, the reduced second metal oxide layer 12' may be become an oxygen-deficient metal oxide layer as a result of the reduction process. For example, the reduced first metal oxide layer 11" may include $TiO_x$ where x is less than two, and the reduced second metal oxide layer 12' may include $TaO_x$ where x is less than 2.5. In other words, the second metal oxide layer 12' may have less than five oxygen atoms for every two tantalum atoms.

In various embodiments, the plasma treatment may be performed under a hydrogen-containing atmosphere, for example, a $H_2$ atmosphere, $H_2/N_2$ atmosphere, $H_2/Ar$ atmosphere, or $NH_3$ atmosphere. Furthermore, the plasma treatment may be performed at a temperature of 250 to 500° C. for 1 to 10 minutes.

As the result of this process, however, the oxygen-rich metal oxide layer for operation of ReRAM is not present in the plasma treated object. Therefore, an oxygen-rich metal oxide layer is formed through a subsequent process illustrated by FIG. 1D. When the oxygen-rich metal oxide layer is not present, a large number of defects such as oxygen vacancies exist at the interface between an electrode and the oxygen-deficient metal oxide layer, and a reversible switching operation becomes difficult. Therefore, the formation of the oxygen-rich metal oxide layer is performed.

Referring to FIG. 1D, a third metal oxide layer 13 is formed over the reduced second metal oxide layer 12'. The third metal oxide layer 13 is an oxygen-rich metal oxide layer having a higher oxygen content than the reduced second metal oxide layer 12', and may be formed of the same metal as the second metal oxide layer 12. That is, the third metal oxide layer 13 is a metal oxide layer satisfying a stoichiometric ratio, and may include $Ta_2O_5$, for example. The third metal oxide layer 13 may be formed by ALD or CVD.

When the third metal oxide layer 13 is formed, an upper portion of the reduced second metal oxide layer 12' under the third metal oxide layer 13 may be oxidized. However, the reduced second metal oxide layer 12' serves as a buffer to limit oxidation of the underlying reduced first metal oxide layer 11" while forming the third metal oxide layer 13. Because at least the oxygen vacancies of the reduced first metal oxide layer 11" are maintained, favorable switching characteristics may be preserved by the reduction of oxygen vacancies.

Furthermore, in order to limit oxidation of the lower layers when the third metal oxide layer 13 is formed, the third metal oxide layer 13 may be formed to a small thickness. For example, the third metal oxide layer 13 may be thinner than the reduced second metal oxide layer 12'. However, a portion of the third metal oxide layer 13 may be lost during a subsequent process of forming a second electrode. Considering the thickness of the portion of the third metal oxide layer 13 which is expected to be lost, the thickness of the third metal oxide layer 13 may be determined by adding the expected thickness loss to the desired final thickness.

Referring to FIG. 1E, a second electrode 14 is formed over a third metal oxide layer 13. The second electrode 14 may include a conductive material, for example, a metal such as Pt, W, Al, Cu, and Ta or a metal nitride such as TiN and TaN.

Accordingly, the variable resistance memory device including the first electrode 10, the second electrode 14, and the variable resistance material layer interposed therebetween is formed, the variable resistance material layer including the reduced first metal oxide layer 11", the reduced second metal oxide layer 12', and the third metal oxide layer 13. The reduced first metal oxide layer 11" and the reduced second metal oxide layer 12' are oxygen-deficient metal oxide layers, and the third metal oxide layer 13 is an oxygen-rich metal oxide layer. For example, the reduced first metal oxide layer 11" and the reduced second metal oxide layer 12' may include a layer containing oxygen at a lower ratio than a stoichiometric ratio, and the third metal oxide layer 13 include a layer satisfying a stoichiometric ratio. Furthermore, the metal of the first metal oxide layer 11 may be different from the metal of the second metal oxide layer 12, and the metal of the second metal oxide layer 12 may be the same as the metal of the third metal oxide layer 13.

In a variable resistance memory device and method for fabricating the same in accordance with an embodiment of the present invention, when forming the variable resistance material layer including the oxygen-deficient metal oxide layer and the oxygen-rich metal oxide layer which are sequentially stacked, it is possible to prevent the number of oxygen vacancies from decreasing in the oxygen-deficient metal oxide layer. Accordingly, it is possible to prevent the degradation of associated switching characteristics.

Figure 2A:
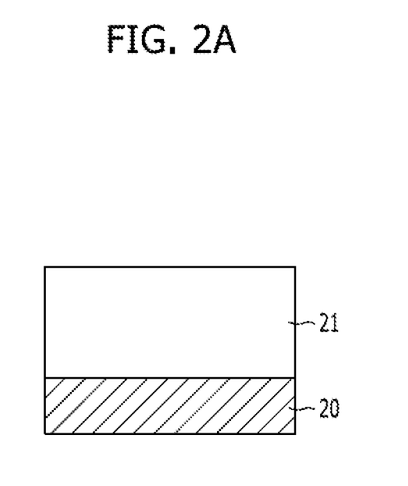
FIGS. 2A to 2E are cross-sectional views illustrating a variable resistance memory device and a method for fabricating the same in accordance with another embodiment of the present invention.
Figure 2B:
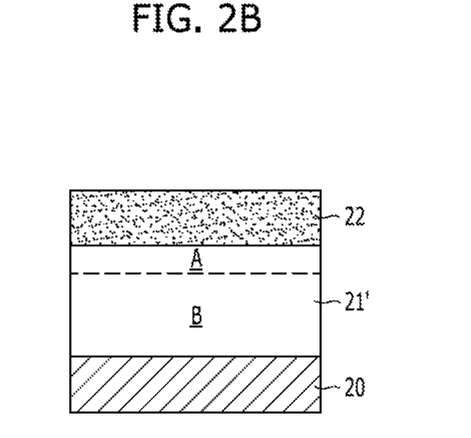
Figure 2C:
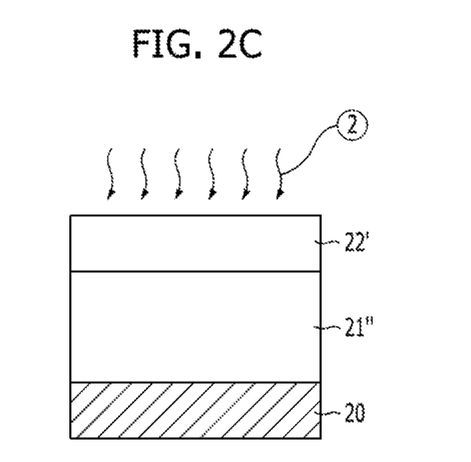
Figure 2D:
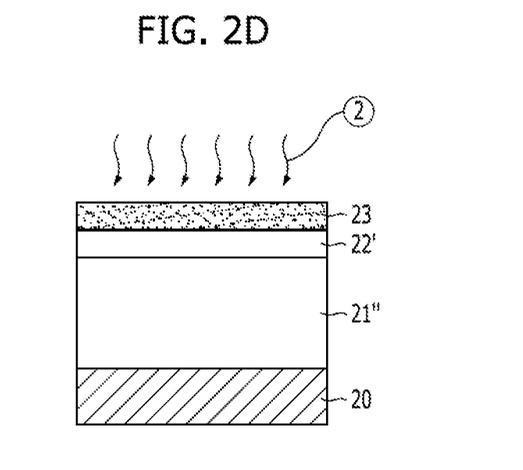
Figure 2E:
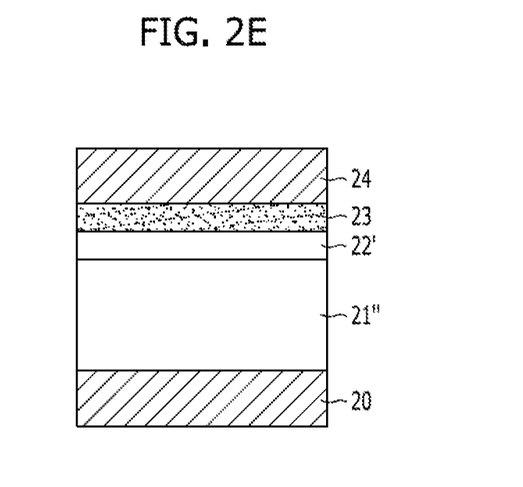

FIGS. 2A to 2E are cross-sectional views for explaining a variable resistance memory device and a method for fabricating the same in accordance with another embodiment of the present invention. In particular, FIGS. 2A to 2E illustrate a device including a variable resistance material layer having an oxygen-deficient metal oxide layer and an oxygen-rich metal oxide layer which are sequentially stacked and a method for fabricating the same. FIG. 2E illustrates the device, and FIGS. 2A to 2D illustrate process steps for fabricating the device of FIG. 2E. Detailed descriptions of elements that are substantially the same as those of FIGS. 1A to 1E are omitted herein.

Processes of FIGS. 2A to 2C are substantially the same as those of FIGS. 1A to 1C. Accordingly, referring to FIG. 2C, a stacked structure of a reduced first metal oxide layer 21" and a reduced second metal oxide layer 22' is formed over a first electrode 20.

Referring to FIG. 2D, an outer surface of the reduced second metal oxide layer 22' is treated by oxygen-containing plasma, or annealed at low temperature under an oxygen-containing gas atmosphere (shown as ②). As a result, the outer surface of the reduced second metal oxide layer 22' is oxidized to form an oxygen-rich metal oxide layer having a higher oxygen content than the reduced second metal oxide layer 22'. The oxygen-rich metal oxide layer is referred to as a third metal oxide layer 23. The third metal oxide layer 23 is a metal oxide layer satisfying a stoichiometric ratio, and may include $Ta_2O_5$, for example. Furthermore, since the third metal oxide layer 23 is formed by the reoxidation of the reduced second metal oxide layer 22', the third metal oxide layer 23 includes the same metal as the metal of the second metal oxide layer 22. Since the third metal oxide layer 23 is formed by the oxidation of an outer portion of the reduced second metal oxide layer 22', the third metal oxide layer 23 may have a small thickness.

The oxygen-containing plasma may include $O_2$ plasma. For example, and the oxygen-containing gas atmosphere may include an $O_2$ atmosphere, $N_2/O_2$ atmosphere, or $H_2/O_2$ atmosphere.

Referring to FIG. 2E, a second electrode 24 is formed over the third metal oxide layer 23.

Accordingly, the variable resistance memory device including the first electrode 20, the second electrode 24, and the variable resistance material layer interposed between the first and second electrodes 20 and 24 is formed, the variable resistance material layer including the reduced first metal oxide layer 21", the reduced second metal oxide layer 22', and the third metal oxide layer 23.

The process of forming the third metal oxide layer in the embodiment illustrated by FIG. 2A-2E differs from the process in the embodiment illustrated by FIG. 1A-1E. In the embodiment of FIG. 1A-1E, the third metal oxide layer 13 is formed by deposition. In the embodiment of FIG. 2A-2E, however, the third metal oxide layer 23 is formed by oxidation. Although different methods are used, the resulting structures may have the same or similar properties.

In the above-described embodiments, a unit memory cell including a variable resistance material layer interposed between two electrodes has been described. In an embodiment, the unit memory cells may be stacked as two or more layers. When the unit memory cells are stacked, a top electrode of the lower memory cell may serve as a bottom electrode of the upper memory cell. In other words, the lower memory cell and the upper memory cell may share a common electrode. Furthermore, in an embodiment, the lower memory cell and the upper memory cell may be symmetrical with each other. Such a structure will be described below in more detail with reference to FIG. 3.

Figure 3:
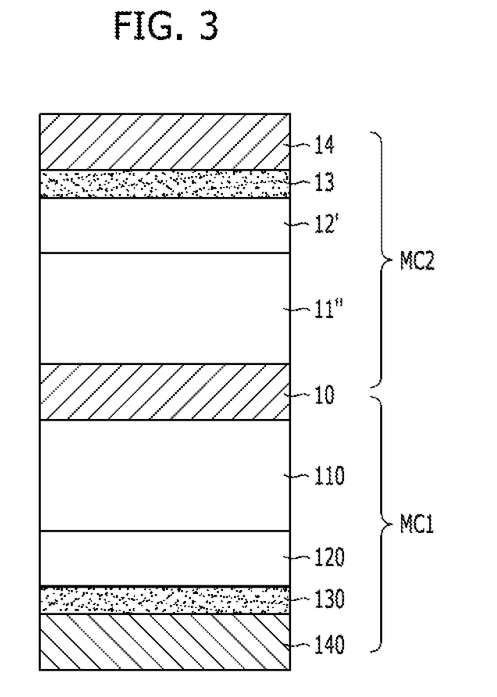
FIG. 3 is a cross-sectional view illustrating a variable resistance memory device and a method for fabricating the same in accordance with another embodiment of the present invention.

FIG. 3 is a cross-sectional view illustrating a variable resistance memory device and a method for fabricating the same in accordance with an embodiment of the present invention.

Referring to FIG. 3, first and second memory cells MC1 and MC2 may be sequentially stacked while sharing the first electrode 10.

In the embodiment shown in FIG. 3, the second memory cell MC2 positioned at the top has substantially the same structure as the memory cell of FIG. 1E.

In an embodiment, the first memory cell MC1 positioned at the bottom may be formed to be symmetrical with the second memory cell MC2, with the first electrode 10 interposed therebetween and acting as the plane of symmetry. Therefore, the first memory cell MC1 includes an oxygen-rich metal oxide layer and an oxygen-deficient metal oxide layer which are sequentially stacked. Specifically, the first memory cell MC1 may include a variable resistance material layer (130, 120, and 110) which is an inverted structure of the variable resistance material layer (11", 12', and 13) of the second memory cell MC2. Reference numerals 130, 120, and 110 represent a fourth metal oxide layer 130 corresponding to the third metal oxide layer 13 of the second memory cell MC2, a fifth metal oxide layer 120 corresponding to the reduced second metal oxide layer 12', and a sixth metal oxide layer 110 corresponding to the reduced first metal oxide layer 11", respectively. In addition, reference numeral 140 represents another electrode of the first memory cell MC1, and is hereafter referred to as a third electrode 140.

A method for forming the first memory cell MC1 will be described briefly as follows.

First, the fourth metal oxide layer 130 is formed over the third electrode 140. In an embodiment, since the third metal oxide layer 13 corresponding to the fourth metal oxide layer 130 is an oxygen-rich metal oxide layer as described above, the fourth metal oxide layer 130 may be formed by ALD or CVD. The fourth metal oxide layer 130 may include a layer such as $Ta_2O_5$, which satisfies a stoichiometric ratio.

Then, the fifth metal oxide layer 120 is formed over the fourth metal oxide layer 130. Because the reduced second metal oxide layer 12' corresponding to the fifth metal oxide layer 120 is an oxygen-deficient metal oxide layer as described above, the fifth metal oxide layer 120 may include an oxygen-deficient metal oxide layer formed by PVD. Furthermore, the fifth metal oxide layer may include a layer such as $TaO_x$, which contains oxygen at a lower ratio than a stoichiometric ratio. In other words, the value of x in $TaO_x$ is less than 2.5.

Subsequently, the sixth metal oxide layer 110 is formed over the fifth metal oxide layer 120. Because the reduced first metal oxide layer 11" corresponding to the sixth metal oxide layer 110 is an oxygen-deficient metal oxide layer as described above, the sixth metal oxide layer 110 may also include an oxygen-deficient metal oxide layer formed by PVD. Furthermore, the sixth metal oxide layer may include a layer such as $TiO_x$ where x<2, which contains oxygen at a lower ratio than a stoichiometric ratio.

A subsequent process, that is, a process of forming the second memory cell MC2, may be performed in substantially the same manner as described with reference to FIGS. 1A to 1E.

In the embodiment of FIG. 3, when the first memory cell MC1 is formed, the fifth metal oxide layer 120 formed on the fourth metal oxide layer 130 does not have a substantial effect on the oxygen content of fourth metal oxide layer 130, which is different from when the second memory cell MC2 is formed. This is because the fourth metal oxide layer 130 is an oxygen-rich metal oxide layer. While forming an oxygen-rich layer over an oxygen deficient layer changes the oxygen vacancy content of the underlying layer, forming an oxygen deficient layer over an oxygen-rich layer may not substantially affect the oxygen vacancy content of the underlying oxygen-rich layer. Therefore, the first memory cell MC1 may be formed by sequentially depositing the fourth metal oxide layer 130, the fifth metal oxide layer 120, and the sixth metal oxide layer 110, without performing a plasma oxidation or reduction process. In an embodiment, the fourth metal oxide layer 130 may be formed by ALD or CVD, and the fifth and sixth metal oxide layers 120 and 110 may be formed by PVD.

In an embodiment, the fifth and sixth metal oxide layers 120 and 110 may be formed of the same metal oxide. In such an embodiment, the first and sixth metal oxide layers 120 and 110 may be formed as one layer by one deposition process. For example, the fifth and sixth metal oxide layers 120 and 110 may be a signal layer formed of $TiO_x$ where x<2 or $TaO_x$ where x<2.5). Accordingly, the first memory cell MC1 may have a structure in which $Ta_2O_5$ and $TiO_x$ (or $TaO_x$) are sequentially stacked, and the second memory cell MC2 may have a structure in which TiOx, TaOx, and $Ta_2O_5$ are sequentially stacked. In this case, the material layers forming the first memory cell MC1 are not symmetrical with the material layers forming the second memory cell MC2. However, while the first memory cell MC1 includes an oxygen-rich metal oxide layer and an oxygen-deficient metal oxide layer which are sequentially stacked, the second memory cell MC2 also includes an oxygen-deficient metal oxide layer and an oxygen-rich metal oxide layer which are sequentially stacked. Therefore, in such an embodiment, the order of the layers in the first memory cells MC1 is symmetrical to the order of layers in the second memory cells MC2.

In another embodiment, although not illustrated, the first memory cell MC1 is arranged above the second memory cell MC2. In such an embodiment, fourth metal oxide layer 130 and third metal oxide layer 13 are adjacent to the first electrode 10, while the sixth metal oxide layer 110 is adjacent to second electrode 14 and the reduced first metal oxide layer 11" is adjacent to third electrode 140.

In an embodiment, one or more memory cells may be stacked over the second memory cell MC2, while being symmetrical about common electrodes. In such an embodiment, memory cell such as the first memory cell MC1 including an oxygen-rich metal oxide layer and an oxygen-deficient metal oxide layer which are sequentially stacked may be formed by depositing the respective layers, and a memory cell such as the second memory cell MC2 including an oxygen-deficient metal oxide layer and an oxygen-rich metal oxide layer which are sequentially stacked may be formed by the process of FIGS. 1A to 1E.

In accordance with embodiments of the present invention, it is possible to implement memory cells which are stacked to be symmetrical with each other. When the respective memory cells are symmetrical with each other, it is possible to achieve the same switching characteristics for each of the upper and lower cells.

The embodiment of FIG. 3 has been described under the supposition that the second memory cell MC2 is identical to the memory cell of FIG. 1E. However, embodiments of the present invention are not limited thereto. In another embodiment, the second memory cell MC2 may be the memory cell of FIG. 2E so that a structure in which the first memory cell MC1 of FIG. 3 and the memory cell of FIG. 2E are stacked may be fabricated. In such an embodiment, a method for forming the first memory cell MC1 may be performed in substantially the same manner as described with reference to FIG. 3, and the memory cell of FIG. 2E may be formed by the process of FIGS. 2A to 2E.

Figure 4:
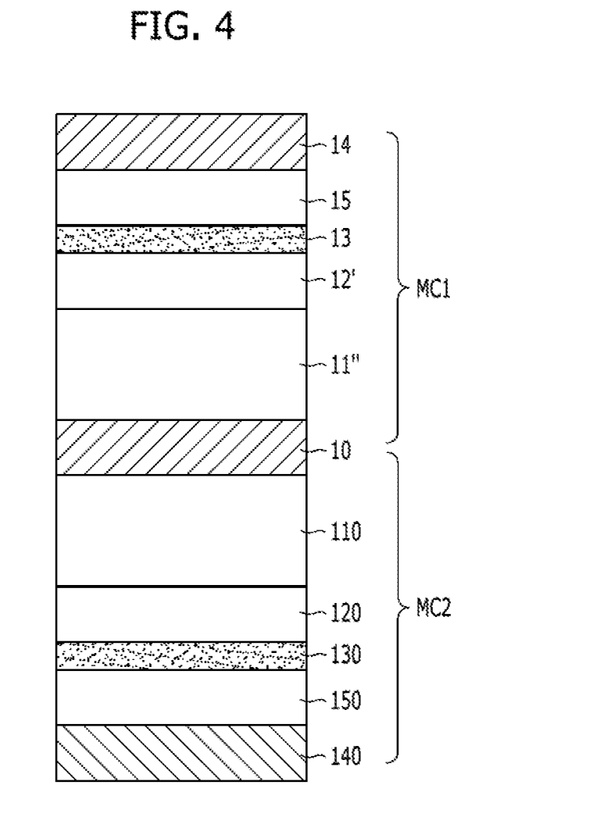
FIG. 4 is a cross-sectional view illustrating a variable resistance memory device in accordance with another embodiment of the present invention.

FIG. 4 is a cross-sectional view illustrating a variable resistance memory device in accordance with another embodiment of the present invention. In particular, FIG. 4 illustrates an embodiment in which a memory cell includes a selecting element connected in series to a variable resistance material layer. The following descriptions will be focused on differences of the embodiment of FIG. 4 from the embodiment of FIG. 3.

Referring to FIG. 4, the first memory cell MC1 further includes a first selecting element 150 interposed between the third electrode 140 and the variable resistance material layer 110, 120, and 130, and the second memory cell MC2 further includes a second selecting element 15 interposed between the second electrode 14 and the variable resistance material layer 11", 12', and 13.

The first and second selecting elements 150 and 15 may limit current below a predetermined voltage, and may include a diode, a transistor, a tunnel barrier, a metal-insulator transition (MIT) element and the like. The first and second selecting elements 150 and 15 may serve to prevent current leakage between memory cells in a cross-point structure, which is described below with reference to FIG. 5. Since each of the first and second selecting elements 150 and 15 may be arranged between the variable resistance material layer and either of the two electrodes at both ends of the variable resistance material layer, in an embodiment, the first and second selecting elements 150 and 15 may be interposed between the first electrode 10 and the variable resistance material layer 110, 120, and 130 and between the first electrode 10 and the variable resistance material layer 11", 12', and 13, respectively.

Like the variable resistance material layers, the first and second selecting elements 150 and 15 may be disposed to be symmetrical with each other, with the first electrode 10 interposed therebetween and acting as a plane of symmetry.

Figure 5:
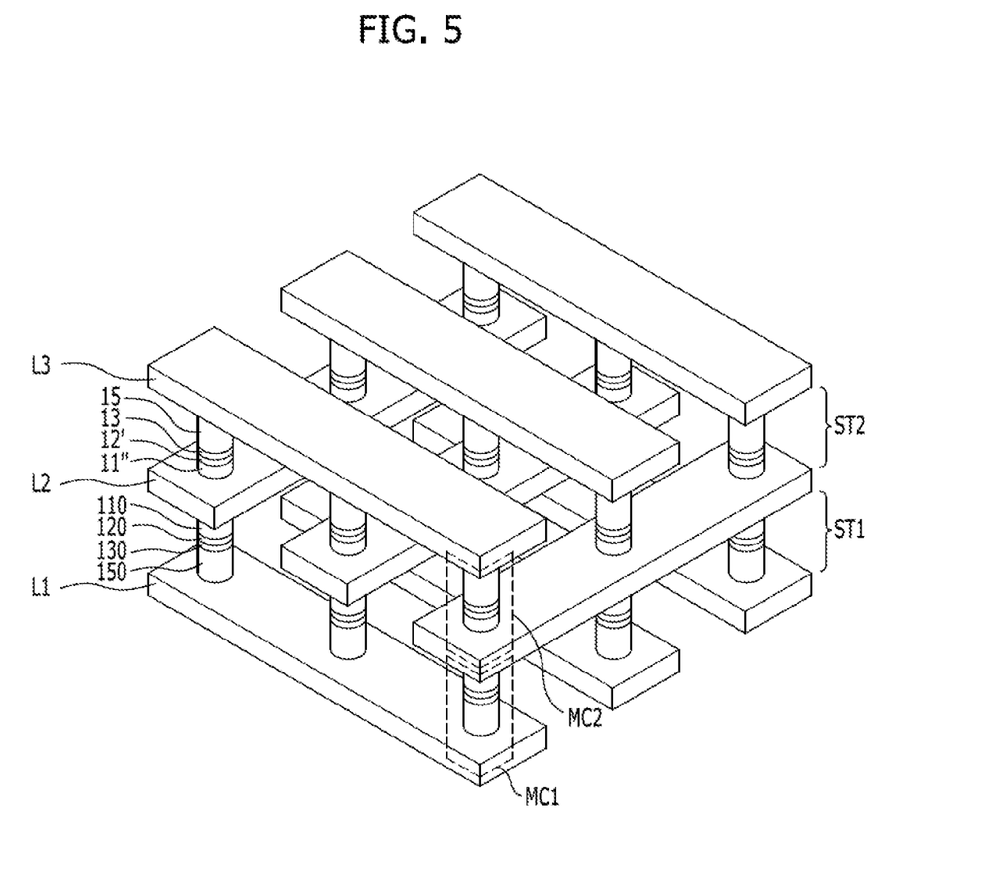
FIG. 5 is a perspective view illustrating a variable resistance memory device in accordance with another embodiment of the present invention.

FIG. 5 is a perspective view of a variable resistance memory device in accordance with an embodiment of the present invention. In particular, FIG. 5 illustrates a variable resistance memory device having a cross-point structure.

Referring to FIG. 5, the variable resistance memory device includes a first stack ST1 and a second stack ST2. The first stack ST1 includes a plurality of first conductive lines L1, a plurality of second conductive lines L2, and a stacked structure of a first selecting element 150 and a first variable resistance material layer 110, 120, and 130. The plurality of first conductive lines L1 are extended in a first direction and arranged in parallel to each other. The plurality of second conductive lines L2 are extended in a second direction crossing the first direction and arranged in parallel to each other. The stacked structure of the first selecting element 150 and the first variable resistance material layer 110, 120, and 130 is interposed between the first and second conductive lines L1 and L2 at each of intersections between the first and second conductive lines L1 and L2. The structure of the first stack ST1 is referred to as a cross-point structure, a unit memory cell such as MC1 is disposed at each of the intersections between the first and second conductive lines L1 and L2. The first and second conductive lines L1 and L2 may function as electrodes of the memory cell.

The second stack ST2 is arranged over the first stack ST1. The second stack ST2 includes the second conductive lines L2, a plurality of third conductive lines L3, and a stacked structure of a second variable resistance material layer 11", 12', and 13 and a second selecting element 15. The plurality of third conductive lines L3 are extended in the first direction crossing the second conductive lines L2 and arranged in parallel to each other. The stacked structure of the variable resistance material layer 11", 12', and 13 and the second selecting element 15 is interposed between the second and third conductive lines L2 and L3 at each of intersections between the second and third conductive lines L2 and L3. Similarly, a unit memory cell such as MC2 of FIG. 5 is arranged at each of the intersections between the second and third conductive lines L2 and L3, and the second conductive line L2 and the third conductive line L3 may function as electrodes of the memory cell. The second conductive line L2 may be shared by the first and second stacks ST1 and ST2.

The unit memory cells MC1 and MC2 in accordance with the embodiment of FIG. 5 have substantially the same structure as the first and second memory cells MC1 and MC2 of FIG. 4, but embodiments of the present invention are not limited thereto. In another embodiment, the first and second memory cells MC1 and MC2 of FIG. 3 may be used.

In accordance with embodiments of the present invention, the two-stack cross-point structure may be implemented. In such embodiments, the first and second stacks ST1 and ST2 may be symmetrical with each other, with the shared second conductive line L2 interposed therebetween. Furthermore, a cross-point structure including three or more stacks may be implemented, and the respective stacks may be symmetrical with each other, with a shared conductive line interposed therebetween.

In accordance with embodiments of the present invention, it is possible to implement a multi-stack structure which has superior switching characteristics through process improvement and form symmetry.

Although various embodiments have been described for illustrative purposes, it will be apparent to those skilled in the art that various changes and modifications may be made without departing from the spirit and scope of the invention as defined in the following claims.

What is claimed is:

1. A method for fabricating a variable resistance memory device, comprising:
   forming an oxygen-deficient first metal oxide layer over a first electrode;
   forming an oxygen-rich second metal oxide layer over the first metal oxide layer;
   treating the first and second metal oxide layers with hydrogen-containing plasma;
   forming an oxygen-rich third metal oxide layer; and
   forming a second electrode over the third metal oxide layer.

2. The method of claim 1, wherein the oxygen-rich second and third metal oxide layers satisfy a stoichiometric ratio, and
   the oxygen-deficient first metal oxide layer contains oxygen at a lower ratio than a stoichiometric ratio.

3. The method of claim 1, wherein forming the first metal oxide layer is performed by physical vapor deposition (PVD), and
   forming the second metal oxide layer is performed by atomic layer deposition (ALD) or chemical vapor deposition (CVD).

4. The method of claim 1, wherein forming the third metal oxide layer includes depositing the third metal oxide layer over the second metal oxide layer.

5. The method of claim 4, wherein depositing the third metal oxide layer is performed by ALD or CVD.

6. The method of claim 1, wherein forming the third metal oxide layer includes oxidizing an outer surface of the second metal oxide layer.

7. The method of claim 6, wherein oxidizing the outer surface of the second metal oxide layer is performed by a plasma treatment using oxygen-containing plasma or by annealing in an atmosphere containing oxygen.

8. The method of claim 1, wherein the first metal oxide layer comprises a different metal from the second metal oxide layer, and
   the second metal oxide layer comprises the same metal as the third metal oxide layer.

9. A method for fabricating a variable resistance memory device which includes a first variable resistance material layer interposed between first and second electrodes and including an oxygen-deficient metal oxide and an oxygen-rich metal oxide which are sequentially stacked therein, and a second variable resistance material layer interposed between the first electrode and a third electrode and including an oxygen-rich metal oxide and an oxygen-deficient metal oxide which are sequentially stacked, the method comprising:
  forming the first variable resistance material layer,
  wherein forming the first variable resistance material layer comprises:
  forming an oxygen-deficient first metal oxide layer;
  forming an oxygen-rich second metal oxide layer over the first metal oxide layer;
  treating the first and second metal oxide layers with hydrogen-containing plasma; and
  forming an oxygen-rich third metal oxide layer.

10. The method of claim 9, wherein the second variable resistance material layer is symmetrical with the first variable resistance material layer, with the first electrode interposed therebetween.

11. The method of claim 10, further comprising forming the second variable resistance material layer, wherein forming of the second variable resistance material layer comprises:
  forming an oxygen-rich metal oxide layer symmetrical with the third metal oxide layer through ALD or CVD; and
  forming oxygen-deficient oxide layers symmetrical with the plasma-treated first and second metal oxide layers through PVD.

12. The method of claim 9, wherein the oxygen-rich second and third metal oxide layers satisfy a stoichiometric ratio, and
  the oxygen-deficient first metal oxide layer contains oxygen at a lower ratio than a stoichiometric ratio.

13. The method of claim 9, wherein forming the first metal oxide layer is performed by PVD, and
  forming the second metal oxide layer is performed by ALD or CVD.

14. The method of claim 9, wherein the third metal oxide layer is formed by depositing the third metal oxide layer on the second metal oxide layer.

15. The method of claim 14, wherein depositing the third metal oxide layer is performed by ALD or CVD.

16. The method of claim 9, wherein the third metal oxide layer is formed by oxidizing the surface of the plasma-treated second metal oxide layer.

17. The method of claim 16, wherein oxidizing the surface of the second metal oxide layer is performed by a plasma treatment using oxygen-containing plasma or by annealing in an atmosphere containing oxygen.

18. The method of claim 9, wherein the first metal oxide layer comprises a different metal from the second metal oxide layer, and
  the second metal oxide layer comprises the same metal as the third metal oxide layer.

* * * * *